(12) United States Patent
Lin et al.

(10) Patent No.: US 11,462,452 B2
(45) Date of Patent: Oct. 4, 2022

(54) CHIP PACKAGE STRUCTURE AND MANUFACTURING METHOD THEREOF

(71) Applicant: Unimicron Technology Corp., Taoyuan (TW)

(72) Inventors: Pu-Ju Lin, Hsinchu (TW); Kai-Ming Yang, Hsinchu County (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/156,626

(22) Filed: Jan. 24, 2021

(65) Prior Publication Data
US 2022/0208631 A1 Jun. 30, 2022

(30) Foreign Application Priority Data
Dec. 28, 2020 (TW) .................... 109146419

(51) Int. Cl.
*H01L 23/00* (2006.01)
*H01L 23/31* (2006.01)
(Continued)

(52) U.S. Cl.
CPC ........ *H01L 23/3135* (2013.01); *H01L 21/561* (2013.01); *H01L 21/78* (2013.01);
(Continued)

(58) Field of Classification Search
CPC ......... H01L 2933/0091; H01L 23/3135; H01L 21/561; H01L 21/78; H01L 23/5226; H01L 24/11; H01L 24/13; H01L 24/96
See application file for complete search history.

(56) References Cited

U.S. PATENT DOCUMENTS

| 8,835,230 B2 | 9/2014 | Scanlan |
| 8,987,057 B2 | 3/2015 | Van Gemert et al. |
| (Continued) | | |

FOREIGN PATENT DOCUMENTS

| TW | 201013858 | 4/2010 |
| TW | I636530 | 9/2018 |

OTHER PUBLICATIONS

"Office Action of Taiwan Counterpart Application", dated Sep. 29, 2021, p. 1-p. 7.

*Primary Examiner* — Mohammad M Choudhry
(74) *Attorney, Agent, or Firm* — JCIPRNET

(57) ABSTRACT

A chip package structure including a chip, a stress buffer layer, a first insulating layer, a redistribution layer, a second insulating layer, and a solder ball is provided. The chip has an active surface, a back surface and a peripheral surface. The stress buffer layer covers the active surface and the peripheral surface, and the first insulating layer is disposed on the back surface. A bottom surface of the stress buffer layer is aligned with the back surface of the chip. The redistribution layer is electrically connected to the chip through an opening of the stress buffer layer. The second insulating layer covers the stress buffer layer and the redistribution layer. The solder ball is disposed in a blind hole of the second insulating layer and electrically connected to the redistribution layer. A top surface of the solder ball protrudes from an upper surface of the second insulating layer.

10 Claims, 6 Drawing Sheets

(51) Int. Cl.
*H01L 23/522* (2006.01)
*H01L 21/56* (2006.01)
*H01L 21/78* (2006.01)

(52) U.S. Cl.
CPC .......... *H01L 23/5226* (2013.01); *H01L 24/11* (2013.01); *H01L 24/13* (2013.01); *H01L 24/96* (2013.01)

(56) References Cited

U.S. PATENT DOCUMENTS

| | | |
|---|---|---|
| 10,062,652 B2 | 8/2018 | Lee et al. |
| 10,177,111 B2 | 1/2019 | Kamphuis et al. |
| 2008/0142946 A1* | 6/2008 | Yang .................. H01L 23/5389 438/118 |
| 2008/0173992 A1* | 7/2008 | Mahler ............... H01L 21/6836 257/676 |
| 2011/0121449 A1* | 5/2011 | Lin ....................... H01L 23/552 257/737 |
| 2017/0162519 A1 | 6/2017 | Ko et al. |

\* cited by examiner

CHIP PACKAGE STRUCTURE AND MANUFACTURING METHOD THEREOF

CROSS-REFERENCE TO RELATED APPLICATION

This application claims the priority benefit of Taiwan application serial no. 109146419, filed on Dec. 28, 2020. The entirety of the above-mentioned patent application is hereby incorporated by reference herein and made a part of this specification.

BACKGROUND

Technical Field

The disclosure relates to a package structure and a manufacturing method thereof, and more particularly to a chip package structure and a manufacturing method thereof.

Description of Related Art

In the related art, a resilient material, a packaging material, or an overhanging structure under a die can be used as an anchor to protect chip edges or enhance the mechanical strength of an encapsulant. At present, in one product, the resilient material or the packaging material only protects the backside and the spherical surface, but fails to effectively protect the chip edges. Or, in another product which uses the packaging material to protect the chip edges, although a chip failure caused by chip cracking can be avoided in a reliability test, a difference in thermal expansion coefficient between the encapsulant and the chip may lead to a decrease in the reliability and product service life.

SUMMARY

The disclosure provides a chip package structure which can effectively protect chip edges and increase the overall structural strength and structural reliability.

The disclosure provides a manufacturing method of a chip package structure, in which the manufacturing method is used to manufacture the aforementioned chip package structure.

A chip package structure according to the disclosure includes a chip, a stress buffer layer, a first insulating layer, a redistribution layer, a second insulating layer, and a solder ball. The chip has an active surface and a back surface opposite to each other, and a peripheral surface connecting the active surface and the back surface. The stress buffer layer covers the active surface and the peripheral surface of the chip, and has an opening exposing a part of the active surface. The first insulating layer is disposed on the back surface of the chip. The stress buffer layer is extended and disposed on the first insulating layer, and a bottom surface of the stress buffer layer is aligned with the back surface of the chip. The redistribution layer is disposed on the active surface of the chip, and extends into the opening of the stress buffer layer. The redistribution layer is electrically connected to the chip through the opening. The second insulating layer covers the stress buffer layer and the redistribution layer, and has a blind hole exposing a part of the redistribution layer. The solder ball is disposed in the blind hole of the second insulating layer, and is electrically connected to the redistribution layer. A top surface of the solder ball protrudes from an upper surface of the second insulating layer.

In an embodiment of the disclosure, the redistribution layer includes a circuit layer and a conductive via. The conductive via is located between the circuit layer and the active surface of the chip. The chip is electrically connected to the circuit layer through the conductive via.

In an embodiment of the disclosure, the first insulating layer has a first peripheral surface, the second insulating layer has a second peripheral surface, and the stress buffer layer has a third peripheral surface. The second peripheral surface is aligned with the third peripheral surface and the first peripheral surface.

In an embodiment of the disclosure, the chip package structure further includes a surface treatment layer disposed on the redistribution layer exposed by the blind hole of the second insulating layer. The solder ball is electrically connected to the redistribution layer through the surface treatment layer.

In an embodiment of the disclosure, a thickness of the stress buffer layer is greater than 0 and less than or equal to 1 micrometer.

In an embodiment of the disclosure, a material of the stress buffer layer is different from a material of the first insulating layer and a material of the second insulating layer.

In an embodiment of the disclosure, the material of the stress buffer layer includes a silane adhesion promoter, a silicone rubber, an epoxy, or a photosensitive dielectric material (such as PI, PBO, BCB, or PID), but is not limited thereto.

In an embodiment of the disclosure, the first insulating layer includes an Ajinomoto Build up Film (ABF) or an encapsulant layer.

In an embodiment of the disclosure, the material of the first insulating layer and the material of the second insulating layer are the same.

In an embodiment of the disclosure, the material of the first insulating layer and the material of the second insulating layer are different.

A manufacturing method of a chip package structure according to the disclosure includes the following steps. A plurality of chips separated from each other are disposed on a first insulating layer. Each of the chips has an active surface and a back surface opposite to each other, and a peripheral surface connecting the active surface and the back surface. The back surface of each of the chips is in direct contact with the first insulating layer. A stress buffer layer is formed on the first insulating layer. The stress buffer layer extends and covers the active surface and the peripheral surface of each of the chips, and a bottom surface of the stress buffer layer is aligned with the back surface of each of the chips. A second insulating layer is formed to cover the stress buffer layer. A redistribution layer is formed in the second insulating layer. The stress buffer layer has an opening exposing a part of the active surface of each of the chips, and the redistribution layer is electrically connected to each of the chips through the opening. A plurality of blind holes separated from each other are formed in the second insulating layer, and the blind holes expose a part of the redistribution layer. A plurality of solder balls are formed respectively in the blind holes, and the solder balls are electrically connected to the redistribution layer exposed by the blind holes. A top surface of each of the solder balls protrudes from an upper surface of the second insulating layer. A singularizing process is performed to cut off the second insulating layer, the stress buffer layer, and the first insulating layer, thereby forming a plurality of chip package structures separated from each other.

In an embodiment of the disclosure, the redistribution layer includes a circuit layer and a conductive via. The conductive via is located between the circuit layer and the active surface of each of the chips. Each of the chips is electrically connected to the circuit layer through the conductive via.

In an embodiment of the disclosure, the first insulating layer of each of the chip package structures has a first peripheral surface, the second insulating layer has a second peripheral surface, and the stress buffer layer has a third peripheral surface. The second peripheral surface is aligned with the third peripheral surface and the first peripheral surface.

In an embodiment of the disclosure, the manufacturing method of the chip package structure further includes the following. Before the solder balls are respectively formed in the blind holes, a surface treatment layer is formed in the blind holes. The surface treatment layer is disposed on the redistribution layer exposed by the blind holes, and the solder balls are electrically connected to the redistribution layer through the surface treatment layer.

In an embodiment of the disclosure, a thickness of the stress buffer layer is greater than 0 and less than or equal to 1 micrometer.

In an embodiment of the disclosure, a material of the stress buffer layer is different from a material of the first insulating layer and a material of the second insulating layer.

In an embodiment of the disclosure, the material of the stress buffer layer includes a silane adhesion promoter, a silicone rubber, an epoxy, or a photosensitive dielectric material (such as PI, PBO, BCB, or PID), but is not limited thereto.

In an embodiment of the disclosure, the first insulating layer includes an ABF or an encapsulant layer.

In an embodiment of the disclosure, the material of the first insulating layer and the material of the second insulating layer are the same.

In an embodiment of the disclosure, the material of the first insulating layer and the material of the second insulating layer are different.

In an embodiment of the disclosure, the manufacturing method of the chip package structure further includes the following. Before the chips separated from each other are disposed on the first insulating layer, a carrier and a release film located on the carrier are provided. The release film is located between the first insulating layer and the carrier. After the singularizing process is performed, the release film and the carrier are removed, thereby exposing a lower surface of the first insulating layer.

Based on the above, in the chip package structure of the disclosure, the stress buffer layer covers the active surface and the peripheral surface of the chip, and the first insulating layer covers the back surface of the chip. That is, the chip is directly covered between the stress buffer layer and the first insulating layer. Thereby, chip edges are protected by the stress buffer layer, and the structural strength of the chip package structure overall is enhanced by the first insulating layer and the second insulating layer. Therefore, the chip package structure of the disclosure can be improved in structural reliability.

In order to make the aforementioned features and advantages of the disclosure more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
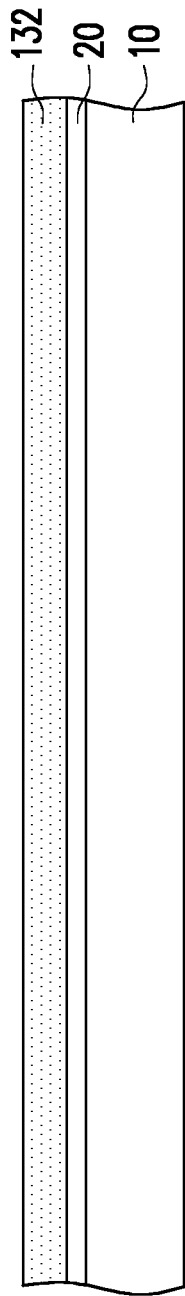
FIG. 1A to FIG. 1G are schematic cross-sectional views showing a manufacturing method of a chip package structure according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1A to FIG. 1G are schematic cross-sectional views showing a manufacturing method of a chip package structure according to an embodiment of the disclosure. FIG. 1H is a schematic cross-sectional view showing a chip package structure according to an embodiment of the disclosure.

Regarding a manufacturing method of a chip package structure according to the present embodiment, first, referring to FIG. 1A, a carrier 10 and a release film 20 located on the carrier 10 are provided. The release film 20 completely covers a surface of the carrier 10, and the release film 20 is, for example, a thermal release film, but is not limited thereto.

Next, referring to FIG. 1A again, a first insulating layer 132 is formed on the release film 20, where the first insulating layer 132 completely covers a surface of the release film 20, and the release film 20 is sandwiched between the first insulating layer 132 and the carrier 10. Here, the first insulating layer is, for example, an ABF or an encapsulant layer, but is not limited thereto.

Figure 1B:
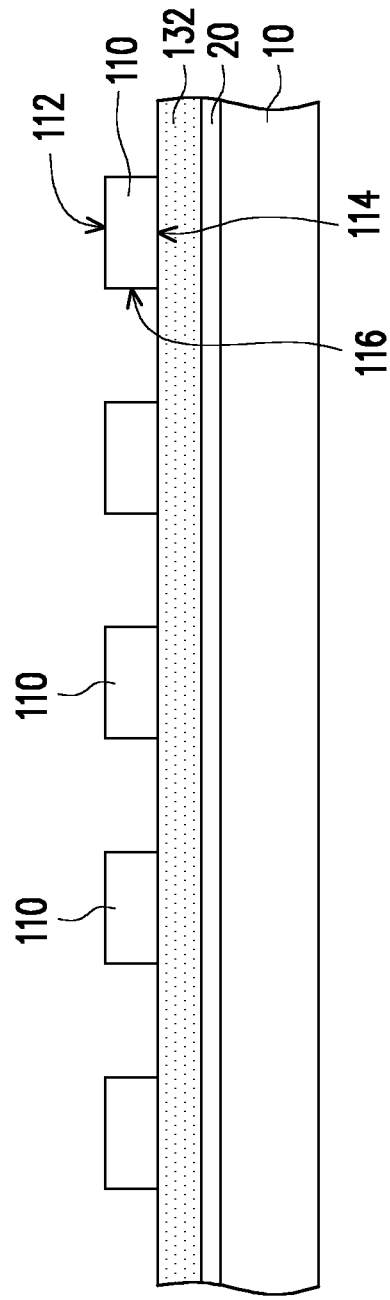

Next, referring to FIG. 1B, a plurality of chips 110 separated from each other are disposed on the first insulating layer 132. Each of the chips 110 has an active surface 112 and a back surface 114 opposite to each other, and a peripheral surface 116 connecting the active surface 112 and the back surface 114. Here, the back surface 114 of each of the chips 110 is in direct contact with the first insulating layer 132.

Figure 1C:
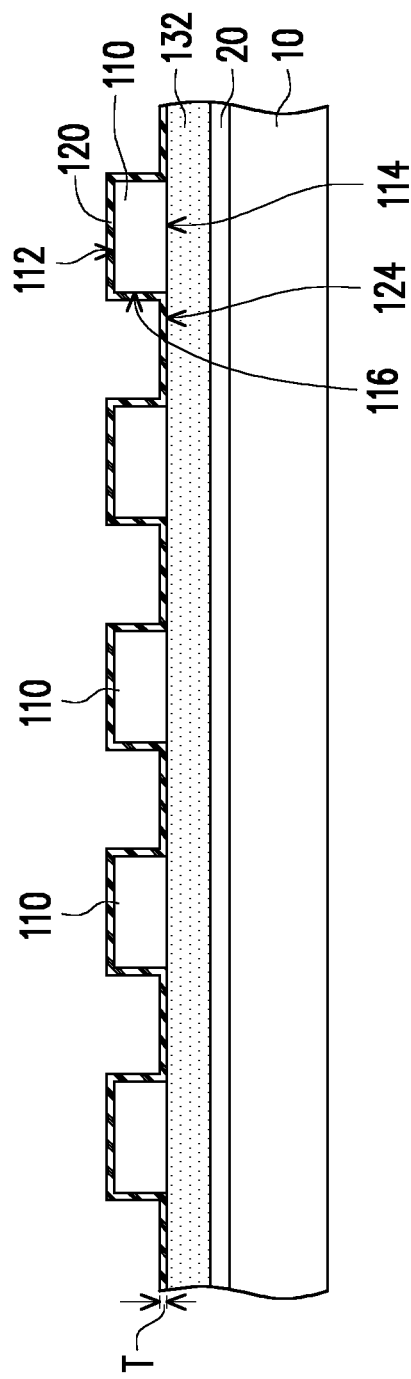

Next, referring to FIG. 1C, a stress buffer layer 120 is formed on the first insulating layer 132. The stress buffer layer 120 extends and covers the active surface 112 and the peripheral surface 116 of each of the chips 110, and a bottom surface 124 of the stress buffer layer 120 is aligned with the back surface 114 of the chip 110. That is to say, the chip 110 of the present embodiment is directly covered between the stress buffer layer 120 and the first insulating layer 132.

Here, a thickness T of the stress buffer layer 120 is, for example, greater than 0 and less than or equal to 1 micrometer, and the method of forming the stress buffer layer 120 is, for example, evaporation or dip-coating, but is not limited thereto. In addition, in the present embodiment, a material of the stress buffer layer 120 is different from a material of the first insulating layer 132. Preferably, the material of the stress buffer layer 120 is, for example, a silane adhesion promoter, a silicone rubber, an epoxy, or a photosensitive dielectric material (such as PI, PBO, BCB, or PID), but is not limited thereto.

Figure 1D:
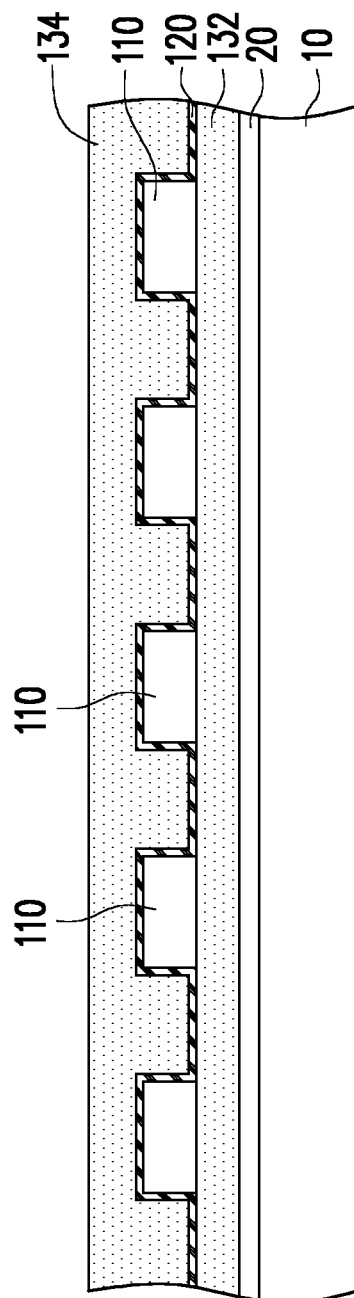

Next, referring to FIG. 1D, a second insulating layer 134 is formed to cover the stress buffer layer 120. Here, a material of the second insulating layer 134 may be the same as the material of the first insulating layer 132, which means that the material of the second insulating layer 134 is an ABF or an encapsulant layer. In another embodiment, the material of the second insulating layer 134 may be different from the material of the first insulating layer 132. In other words, the material of the stress buffer layer 120 in the present embodiment is different from the material of the first insulating layer 132 and the material of the second insulating layer 134. Preferably, a thickness of the second insulating layer 134 is greater than a thickness of the first insulating layer 132, and the thickness of the second insulating layer 134 is at least 150 micrometers.

Figure 1E:
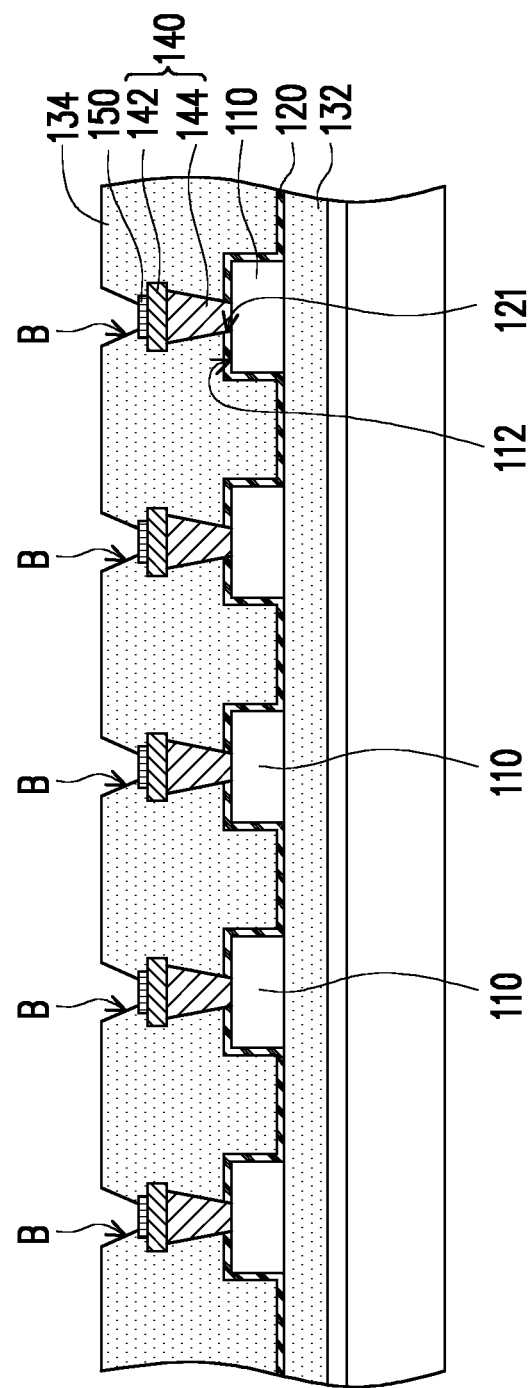

Next, referring to FIG. 1E, a redistribution layer 140 is formed in the second insulating layer 134. The stress buffer layer 120 has an opening 121 exposing a part of the active surface 112 of the chip 110, and the redistribution layer 140 is electrically connected to the chip 110 through the opening 121. Here, the redistribution layer 140 includes a circuit layer 142 and a conductive via 144, and the circuit layer 142 is embodied as a patterned circuit layer. The conductive via 144 is located between the circuit layer 142 and the active surface 112 of the chip 110, and the chip 110 is electrically connected to the circuit layer 142 through the conductive via 144.

Next, referring to FIG. 1E again, a plurality of blind holes B separated from each other are formed in the second insulating layer 134, and the blind holes B expose a part of the redistribution layer 140. As shown in FIG. 1E, a part of the circuit layer 142 of the redistribution layer 140 is exposed by the blind holes B. Then, a surface treatment layer 150 is formed in the blind holes B, and the surface treatment layer 150 is disposed on the redistribution layer 140 exposed by the blind holes B. That is, the surface treatment layer 150 is disposed on the circuit layer 142 exposed by the blind holes B. Here, the surface treatment layer 150 is, for example, an electroless nickel electroless palladium immersion gold (ENEPIG), an organic solderability preservative (OSP) layer, or an electroless nickel immersion gold (ENIG), but is not limited thereto.

Figure 1F:
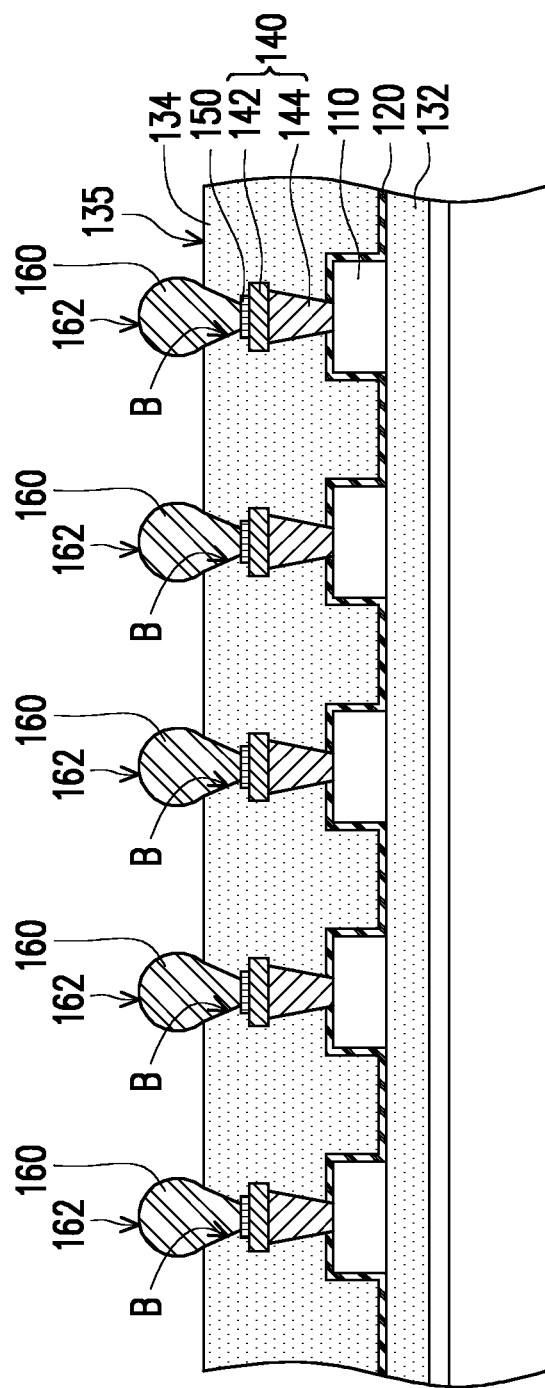

Next, referring to FIG. 1F, a plurality of solder balls 160 are formed respectively in the blind holes B, and the solder balls 160 are electrically connected to the redistribution layer 140 exposed by the blind holes B. More specifically, the solder balls 160 are electrically connected to the redistribution layer 140 through the surface treatment layer 150. Here, a top surface 162 of each of the solder balls 160 protrudes from an upper surface 135 of the second insulating layer 134 and is electrically connected to an external circuit.

Figure 1G:
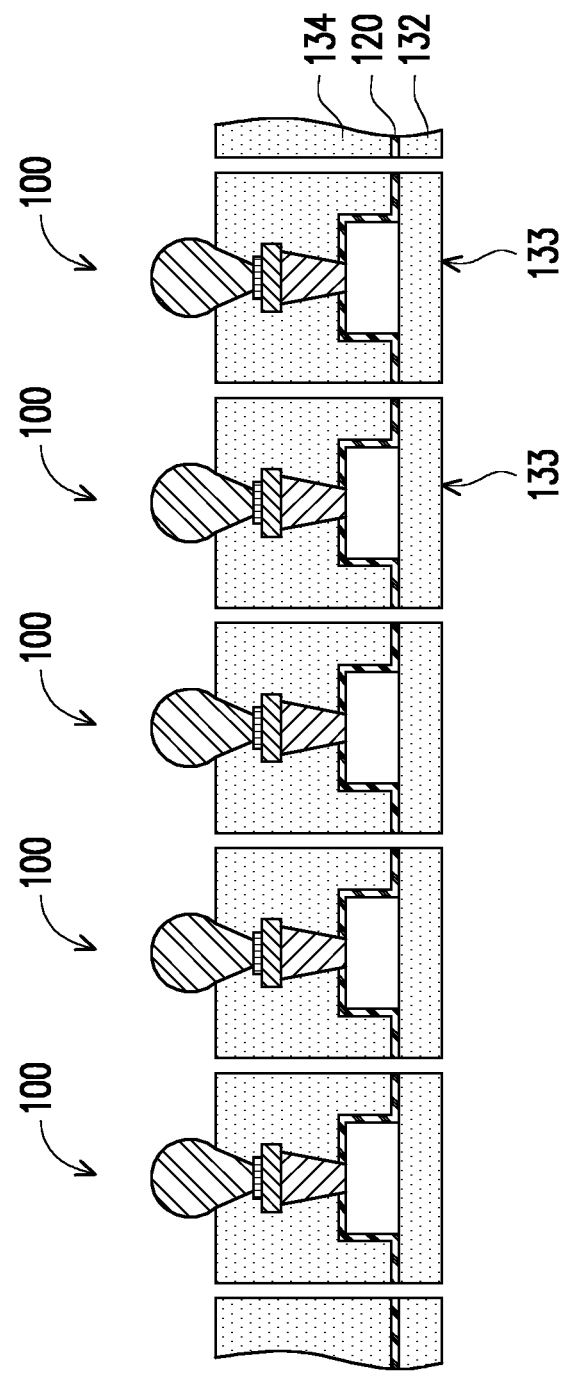
Figure 1H:
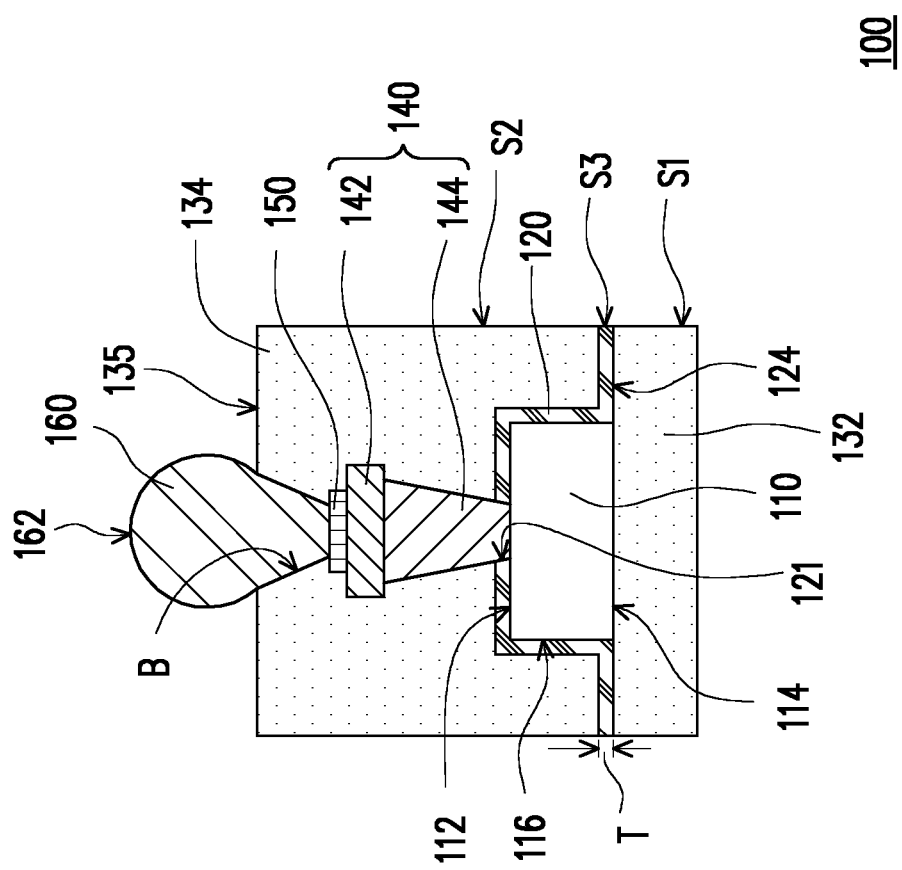
FIG. 1H is a schematic cross-sectional view showing a chip package structure according to an embodiment of the disclosure.

Next, referring to FIG. 1F and FIG. 1G at the same time, a singularizing process is performed to cut off the second insulating layer 134, the stress buffer layer 120, and the first insulating layer 132, thereby forming a plurality of chip package structures 100 separated from each other. After that, the release film 20 and the carrier 10 are removed, and a lower surface 133 of the first insulating layer 132 is exposed. At this point, the manufacture of the chip package structure 100 is completed.

In short, the present embodiment uses wafer-level packaging technology in which, after the chip 110 is disposed behind the carrier 10, the stress buffer layer 120 is coated first. Then, the manufacture of the redistribution layer 140 and the surface treatment layer 150 and a ball mounting process are performed. Finally, dicing and disassembly are performed, and the chip package structure 100 of the present embodiment is completed.

In terms of structure, referring to FIG. 1H, the chip package structure 100 includes the chip 110, the stress buffer layer 120, the first insulating layer 132, the redistribution layer 140, the second insulating layer 134, and the solder ball 160. The chip 110 has the active surface 112 and the back surface 114 opposite to each other, and the peripheral surface 116 connecting the active surface 112 and the back surface 114. The stress buffer layer 120 covers the active surface 112 and the peripheral surface 116 of the chip 110, and has the opening 121 exposing a part of the active surface 112 of the chip 110. Here, the thickness T of the stress buffer layer 120 is, for example, greater than 0 and less than or equal to 1 micrometer. Preferably, the material of the stress buffer layer 120 is, for example, a silane adhesion promoter, a silicone rubber, an epoxy, or a photosensitive dielectric material (such as PI, PBO, BCB, or PID), but is not limited thereto.

In addition, the first insulating layer 132 of the present embodiment is disposed on the back surface 114 of the chip 110. The stress buffer layer 120 is extended and disposed on the first insulating layer 132, and the bottom surface 124 of the stress buffer layer 120 is aligned with the back surface 114 of the chip 110. The redistribution layer 140 is disposed on the active surface 112 of the chip 110, and extends into the opening 121 of the stress buffer layer 120, and the redistribution layer 140 is electrically connected to the chip 110 through the opening 121. Furthermore, the redistribution layer 140 includes the circuit layer 142 and the conductive via 144. The conductive via 144 is located between the circuit layer 142 and the active surface 112 of the chip 110, and the chip 110 is electrically connected to the circuit layer 142 through the conductive via 144. The second insulating layer 134 covers the stress buffer layer 120 and the redistribution layer 140, and has the blind hole B exposing a part of the redistribution layer 140.

More specifically, the first insulating layer 132 has a first peripheral surface S1, the second insulating layer 134 has a second peripheral surface S2, and the stress buffer layer 120 has a third peripheral surface S3. Preferably, the second peripheral surface S2 is aligned with the third peripheral surface S3 and the first peripheral surface S1. Here, the material of the first insulating layer 132 and the material of the second insulating layer 134 may be the same or different, and the first insulating layer 132 is, for example, an ABF or an encapsulant layer. The material of the stress buffer layer 120 is different from the material of the first insulating layer 132 and the material of the second insulating layer 134.

In addition, the solder ball 160 of the present embodiment is disposed in the blind hole B of the second insulating layer 134 and electrically connected to the redistribution layer 140, and the top surface 162 of the solder ball 160 protrudes from the top surface 135 of the second insulating layer 134 and is electrically connected to the external circuit. Besides, the chip package structure 100 of the present embodiment further includes the surface treatment layer 150 disposed on the redistribution layer 140 exposed by the blind hole B of the second insulating layer 134. The solder ball 160 is electrically connected to the redistribution layer 140 through the surface treatment layer 150. The surface treatment layer 150 is, for example, ENEPIG, an OSP layer, or ENIG, but is not limited thereto.

In short, the chip 110 of the present embodiment is directly covered between the stress buffer layer 120 and the first insulating layer 132. Thereby, the chip edges are protected by the stress buffer layer 120, and the structural strength of the chip package structure 100 overall is enhanced by the first insulating layer 132 and the second insulating layer 134. Therefore, the chip package structure 100 of the present embodiment can be improved in structural reliability.

In summary, in the chip package structure of the disclosure, the stress buffer layer covers the active surface and the peripheral surface of the chip, and the first insulating layer covers the back surface of the chip. That is, the chip is directly covered between the stress buffer layer and the first insulating layer. Thereby, the chip edges are protected by the stress buffer layer, and the structural strength of the chip package structure overall is enhanced by the first insulating layer and the second insulating layer. Therefore, the chip package structure of the disclosure can be improved in structural reliability.

Although the disclosure has been described with reference to the above embodiments, they are not used to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A chip package structure, comprising:
   a chip, having an active surface and a back surface opposite to each other, and a peripheral surface connecting the active surface and the back surface;
   a stress buffer layer, covering the active surface and the peripheral surface of the chip, and having an opening exposing a part of the active surface of the chip;
   a first insulating layer, disposed on the back surface of the chip, wherein the stress buffer layer is extended and disposed on the first insulating layer, and a bottom surface of the stress buffer layer is aligned with the back surface of the chip, the back surface of the chip directly contacts the first insulating layer;
   a redistribution layer, disposed on the active surface of the chip, and extending into the opening of the stress buffer layer, the redistribution layer being electrically connected to the chip through the opening;
   a second insulating layer, covering the stress buffer layer and the redistribution layer, and having a blind hole exposing a part of the redistribution layer; and
   a solder ball, disposed in the blind hole of the second insulating layer, and electrically connected to the redistribution layer, a top surface of the solder ball protruding from an upper surface of the second insulating layer.

2. The chip package structure according to claim 1, wherein the redistribution layer comprises a circuit layer and a conductive via, the conductive via is located between the circuit layer and the active surface of the chip, and the chip is electrically connected to the circuit layer through the conductive via.

3. The chip package structure according to claim 1, wherein the first insulating layer has a first peripheral surface, the second insulating layer has a second peripheral surface, the stress buffer layer has a third peripheral surface, and the second peripheral surface is aligned with the third peripheral surface and the first peripheral surface.

4. The chip package structure according to claim 1, further comprising:
   a surface treatment layer, disposed on the redistribution layer exposed by the blind hole of the second insulating layer, wherein the solder ball is electrically connected to the redistribution layer through the surface treatment layer.

5. The chip package structure according to claim 1, wherein a thickness of the stress buffer layer is greater than 0 and less than or equal to 1 micrometer.

6. The chip package structure according to claim 1, wherein a material of the stress buffer layer is different from a material of the first insulating layer and a material of the second insulating layer.

7. The chip package structure according to claim 6, wherein the material of the stress buffer layer comprises a silane adhesion promoter, a silicone rubber, an epoxy, or a photosensitive dielectric material.

8. The chip package structure according to claim 1, wherein the first insulating layer comprises an Ajinomoto Build up Film (ABF) or an encapsulant layer.

9. The chip package structure according to claim 8, wherein a material of the first insulating layer and a material of the second insulating layer are the same.

10. The chip package structure according to claim 8, wherein a material of the first insulating layer and a material of the second insulating layer are different.

* * * * *